(12) United States Patent
Mills et al.

(10) Patent No.: US 6,168,859 B1
(45) Date of Patent: Jan. 2, 2001

(54) FILLER POWDER COMPRISING A PARTIALLY COATED ALUMINA POWDER AND PROCESS TO MAKE THE FILLER POWDER

(75) Inventors: Lynne K. Mills; Eric J. Swedberg, both of Midland, MI (US); Arne K. Knudsen, San Diego, CA (US)

(73) Assignee: The Dow Chemical Company, Midland, MI (US)

( * ) Notice: Under 35 U.S.C. 154(b), the term of this patent shall be extended for 0 days.

(21) Appl. No.: 09/086,926

(22) Filed: May 29, 1998

Related U.S. Application Data
(60) Provisional application No. 60/072,960, filed on Jan. 29, 1998.

(51) Int. Cl.$^7$ ....................................................... B32B 5/16
(52) U.S. Cl. ..................... 428/329; 428/331; 428/403; 428/404; 428/620; 428/701; 428/704; 438/778; 438/780
(58) Field of Search ..................... 428/323, 403, 428/404, 620, 701, 704, 331, 329; 438/758, 778, 780

(56) References Cited

U.S. PATENT DOCUMENTS

| | | | |
|---|---|---|---|
| 3,649,886 | * 3/1972 | Kooi | 317/235 R |
| 4,766,162 | 8/1988 | Hamamoto et al. | 523/440 |
| 4,980,307 | * 12/1990 | Ito et al. | 437/40 |
| 5,011,870 | 4/1991 | Peterson | 523/220 |
| 5,049,596 | 9/1991 | Fujimoto et al. | 523/427 |
| 5,150,195 | 9/1992 | Nguyen | 357/72 |
| 5,202,753 | 4/1993 | Shintai | 257/787 |
| 5,232,970 | 8/1993 | Solc et al. | 524/404 |
| 5,234,712 | 8/1993 | Howard | 427/215 |
| 5,244,707 | * 9/1993 | Shores | 428/76 |
| 5,298,328 | 3/1994 | Abe et al. | 428/403 |
| 5,349,240 | 9/1994 | Narita et al. | 257/791 |
| 5,391,924 | 2/1995 | Uchida et al. | 257/789 |
| 5,430,330 | 7/1995 | Takahama et al. | 257/788 |
| 5,508,110 | 4/1996 | Howard | 428/402 |
| 5,589,714 | 12/1996 | Howard | 257/788 |
| 5,601,874 | 2/1997 | Howard et al. | 427/215 |
| 5,780,162 | * 7/1998 | Toyoda et al. | 428/428 |
| 5,856,028 | * 1/1999 | Thimm | 428/627 |
| 5,923,945 | * 7/1999 | Eisman et al. | 428/552 |

FOREIGN PATENT DOCUMENTS

S61-266456 of 1986 (JP).
H4-96929 of 1992 (JP).

OTHER PUBLICATIONS

P. Bujard, et al., "Thermal Conductivity of Molding Compounds for Plastic Packaging," 44$^{th}$ Electronic Components & Technology Conference, May 1–4, 1994.

* cited by examiner

*Primary Examiner*—H. Thi Le
(74) *Attorney, Agent, or Firm*—Kevin J. Nilsen

(57) ABSTRACT

A filler powder comprised of an alumina powder coated with a silicon containing coating, wherein the silicon containing coating at most partially covers the surface of said coated alumina powder and the filler powder, when mixed with a thermosetting epoxy resin, has an average spiral flow length that is at least about 1.1 times greater than a comparable filler powder containing uncoated alumina powder mixed with the thermosetting resin. A preferred process for making the filler powder comprises: heating, simultaneously, an alumina powder with a second powder coated with an organo-silicate to a temperature for a time sufficient to volatilize, deposit and pyrolyze at least a portion of the organo-silicate on the alumina powder to form a silicon containing inorganic coating thereon.

18 Claims, No Drawings

FILLER POWDER COMPRISING A PARTIALLY COATED ALUMINA POWDER AND PROCESS TO MAKE THE FILLER POWDER

CROSS-REFERENCE TO RELATED APPLICATION

This application claims the benefit of U.S. Provisional Application Ser. No. 60/072,960, filed Jan. 29, 1998.

FIELD OF THE INVENTION

The invention relates to filler powders for use in plastics used to encapsulate components, such as semiconductor devices.

BACKGROUND OF THE INVENTION

Semiconductor devices are commonly encapsulated to protect them from hazards, such as air, moisture, chemicals, dust and light, and to provide them with greater physical strength. The encapsulating material must be an electrical insulator, such as a dense ceramic or more commonly an organic resin. The most common of these organic resins are thermosetting epoxy resins.

These organic resins almost always contain fillers. The most common filler is fused silica. Fillers, such as fused silica, decrease the coefficient of thermal expansion (CTE) of the resin to more closely match the CTE of the encapsulated device (e.g., integrated circuit) and leads attached to the device. This prevents damage to the device from thermal cycling and reduces forces on the surface of the semiconductor during manufacture and in use.

The filler generally comprises greater than 50 percent by volume of the encapsulant to achieve the above effects. Besides the organic resin, the encapsulant may also contain other components, such as resin, catalyst, waxes and opacifiers. To achieve a high filler loading, the filler must have a broad particle size distribution containing a significant amount of fine particles (i.e., less than about 1 micrometer).

During operation, semiconductors generate heat which must be dissipated. As these devices shrink and become more complex, heat removal becomes more and more of a problem. A major disadvantage of silica-filled encapsulants is their low thermal conductivity, which limits their ability to dissipate heat from the encapsulated semiconductor. For this reason, there is a desire to provide approaches to improve heat dissipation in these devices.

One approach incorporates metal heat sinks or metal heat spreaders to the encapsulated device. These provide a means for rapid heat dissipation, but may be limited by space requirements (e.g., in cellular phones), and require additional parts, steps or both to make the device.

Another approach encapsulates the semiconductor in a resin loaded with a filler having a high thermal conductivity. Examples of these fillers include aluminum oxide (alumina), boron nitride, silicon carbide, silicon nitride and aluminum nitride. All of these improve the thermal conductivity of the encapsulant compared to equivalent silica-filled systems. However, silicon carbide tends to be too abrasive because of its high hardness resulting in unacceptable wear to process equipment.

The nitrides suffer from hydrolytic instability which may bloat the encapsulant causing the device to fail. This instability also makes it difficult to form powders having a significant amount of fine particles. The nitrides also contain basic nitrogen containing groups that can catalyze the curing of the epoxy resins making them difficult to process. Alumina also contains basic hydroxyl surface groups that can catalyze the curing of epoxy resins and, because of its hardness, is also abrasive to processing equipment.

To overcome some of these problems, aluminum nitride and alumina, for example, have been coated with silica-type coatings. The coatings generally are formed by first coating the aluminum nitride or alumina powder with a silica source (e.g., organo-silicate) and then heating the coated powder. The coatings tend to be thick relative to the starting powder size, which generally decreases the thermal conductivity of the powder. These coatings also must often be applied more than once to achieve a sufficient coating, which increases the cost of the process and the powder.

Accordingly, it would be desirable to provide a filler powder that improves the heat dissipation of an encapsulant compared to a silica-filled encapsulant, while avoiding some of the problems of the prior art, such as those described above. It would also be desirable to provide an improved method for making the filler powder.

SUMMARY OF THE INVENTION

A first aspect of the invention is filler powder comprised of an alumina powder coated with a silicon containing coating, wherein the silicon containing coating at most partially covers the surface of said coated alumina powder and the filler powder, when mixed with a thermosetting epoxy resin, has an average spiral flow length that is at least about 1.1 times greater than a comparable filler powder containing uncoated alumina powder mixed with the thermosetting resin. Uncoated alumina powder is the coated alumina powder before it has been coated. Comparable filler powder is the same as the filler powder except that it contains uncoated alumina powder instead of the coated alumina powder.

The coated alumina powder of the filler powder avoids the problem of decreased thermal conductivity associated with thick silica coatings, while surprisingly still avoiding the problem, for example, of catalyzing the curing of an epoxy resin. This premature curing typically results in a reduced average spiral flow length.

In a particular preferred embodiment, it has been surprisingly found that the coated alumina may be blended with AlN without catalyzing the hydrolysis of the AlN. It is surprising because (1) the coated alumina of this invention is only partially coated with silica and (2) it is known that surface hydroxyl groups of alumina powder catalyze the hydrolysis of AlN. It is even more surprising that the amount of Si on the surface of the alumina may be, for example, less than 1000 ppm of the total weight of the coated alumina powder.

A second aspect of the invention is a process for making a filler powder comprising: heating, simultaneously, an alumina powder with a second filler powder coated with an organo-silicate to a temperature, for a time, sufficient to volatilize, deposit and pyrolyze at least a portion of the organo-silicate on the alumina powder to form a silicon containing inorganic coating thereon (i.e., form the coated alumina powder). The process has the advantage, for example, of processing an AlN that must be coated to be a useable filler simultaneously with an alumina powder. The process, consequently, can avoid separately processing and subsequent blending of the AlN and alumina powders.

The filler powder may be used in molding compositions to encapsulate electronic devices or used in other thermal management applications.

DETAILED DESCRIPTION OF THE INVENTION

The Coated Alumina Powder

The coated alumina powder is comprised of an alumina powder coated with a silicon containing coating, wherein the silicon containing coating at most partially covers the surface of the coated alumina powder.

The alumina powder coated with the silicon containing coating may be any alumina powder known in the art. Suitable alumina powders that can be coated include, for example, calcined alumina, tabular alumina, fused alumina, synthetic boehmite alumina and alumina platelets. Preferably the alumina is a calcined alumina.

The silicon containing coating only partially covers the surface of the alumina powder. Wherein "partially covers" means the particles fail to have a distinct coating that completely envelopes each particle, as determined by microscopic techniques (e.g., transmission electron microscopy or scanning electron microscopy). Surprisingly, the amount of silicon of the coating of the coated alumina may be less than about 5000 ppm by weight of the coated alumina powder. Preferably the amount of silicon present is less than about 1000 ppm, more preferably less than about 500, even more preferably less than about 250 ppm and most preferably less than about 100 ppm to generally at least about 10 ppm by weight of the coated alumina powder. The amount of silicon from the coating may be determined by known bulk analysis techniques, such as X-ray fluorescence of the coated powder and uncoated powder or surface analysis techniques, such as Auger Emission Spectroscopy, Secondary Ion Mass Spectroscopy and Electron Spectroscopy for Chemical Analysis.

The Filler Powder

Even though the filler powder may be comprised entirely of the coated alumina, it is highly desirable that the filler powder is comprised of the coated alumina powder blended with a second powder. It is desirable because the alumina powder generally has a lower thermal conductivity and is more abrasive, for example, than nitride powders. In addition, since alumina generally is easier to grind to a small particle size, it is advantageous to form a filler having a broad particle size distribution using a second powder having a larger particle size.

Consequently, the coated alumina powder desirably provides a substantial portion of the filler powder particles having a particle size of less than about 1 micrometer in diameter. Substantial portion means, herein, that at least about 50 percent of the particles by number of the filler powder particles, that are less than 1 micrometer in diameter, are the coated alumina particles. Preferably at least about 70 percent of the particles, more preferably at least about 80 percent and most preferably at least about 90 percent by number of the filler powder particles are coated alumina powder particles.

Generally, it is preferred that the average particle size of the coated alumina powder is less than 2 micrometers and the average particle size of the second powder is greater than 2 micrometers. More preferably the average particle size of the second powder is at least about 5, even more preferably at least about 10 micrometers, to generally at most about 50 micrometers in diameter. Also, typically, about 90 percent by number of the coated alumina powder particles have a diameter less than about 5 micrometers in diameter. Whereas, about 90% by number of the second powder particles, typically, have a diameter of less than about 50 micrometers with the largest particle being about 200 micrometers. The particle size may be determined by known techniques, such as microscopic techniques.

The second powder may be any material, other than alumina, that is electrically insulating (e.g., ZnO and $TiO_2$. Preferably the second filler powder has a higher thermal conductivity than the coated alumina powder. Particularly preferred powders include aluminum nitride, silicon nitride, boron nitride or mixtures thereof. More preferably the second powder is aluminum nitride that has been coated to reduce reactivity with water. Preferably the aluminum nitride is a powder having a Si-Al-O-N surface, such as those described by U.S. Pat. No. 5,508,110, incorporated herein by reference.

Generally, the amount of the coated alumina powder and the second powder present in the filler powder depends, for example, on the solid loading of the filler powder in the resin, flow of the filled resin and thermal conductivity of the filled resin. Since the coated alumina powder may provide a substantial portion of the fine particles of the filler powder and, generally, has a lower thermal conductivity than preferred second powders (e.g., AlN, $Si_3N_4$ or BN), the coated alumina generally provides at most about 50 percent by weight of the filler powder. Preferably the coated alumina powder is present in the filler powder in an amount of at most about 40 percent, more preferably at most about 25 percent, even more preferably at most about 20 percent by weight and most preferably at most about 10 percent by weight of the filler powder.

The filler powder, when mixed with a thermosetting epoxy resin described herein and in U.S. Pat. No. 5,232,970, incorporated by reference, has an average spiral flow length that is at least about 1.1 times greater than a comparable filler powder containing uncoated alumina powder. The comparable filler powder is nearly identical to the filler powder as allowable, for example, by human error, experimental variation, process variation and raw material lot to lot variation. Preferably the filler powder-epoxy mixture has an average spiral length that is at least about 1.5 times, more preferably at least about 2 times, even more preferably at least 3 times and most preferably at least about 4 times greater in length than the average spiral flow length of the corresponding epoxy-comparable filler mixture.

The average spiral flow length is determined by ASTM D3123-94 using essentially the same conditions for filler powder and comparable filler powder. In determining the average spiral flow length, the test must be performed under the following conditions: (1) the amount of filler powder mixed with epoxy resin is greater than about 50 percent by weight of the total mixture; (2) the epoxy, when mixed with the filler, has a spiral flow length that ranges from about 1 inch to at most the maximum length of the die and (3) the filler powder contains at least about 5 percent by volume of the coated alumina powder.

Method of Forming the Filler Powder

The filler powder may be formed by any suitable method to form the coated alumina powder. When desired, the coated alumina may be mixed by any suitable method with the second powder to form the filler powder. For example, the second powder may be blended by known methods with an uncoated alumina powder, wherein the alumina is subsequently coated. The second powder may also simply be blended with the coated alumina powder.

The coated alumina powder is preferably formed by coating uncoated alumina powder with an organo-silicate generally having the following structure:

wherein each R is an alkyl or alkoxyalkyl radical, where R has from 1–12 carbon atoms and n is a number from 0 to 2. The alkyl may be linear or branched. Examples of organosilicates include tetramethylorthosilicate, tetraethylorthosilicate, tetra-n-propylorthosilicate, tetraisopropylorthosilicate, tetrabutylorthosilicate, hexamethoxydisiloxane and octamethoxytrisilane and tetramethoxyethylsilicate.

The organo-silicate may be applied by any convenient method, such as those known in the art. Examples include chemical vapor deposition and solution processes, such as those described in Chapter 9 of *Handbook of Tribology Materials, Coating and Surface Treatments*, Bushan and Gupta, McGraw-Hill, Inc., NY, 1991 and U.S. Pat. No. 5,508,110, respectively, each incorporated herein by reference.

The organo-silicate is then thermally treated by heating to a temperature under an atmosphere sufficient to form the coated alumina. Generally, the thermal treatment causes the organo-silicate to become a silicon containing inorganic coating substantially devoid of alkyl, hydroxyl and alkyloxy groups (e.g., silica coating). The temperature of the thermal treatment typically ranges from about 350° C. to about 1000° C. Preferably the temperature is at least about 500° C., more preferably at least about 600° C. to preferably at most about 800° C. and most preferably at most about 700° C. The thermal treatment preferably is performed under an atmosphere containing oxygen such as air or an inert gas or nitrogen mixed with oxygen or air.

In a preferred embodiment, the filler powder is made by first coating a second powder with an organo-silicate and drying the powder at a low temperature of about 50° C. to 175° C. The coated second powder is then blended with uncoated alumina powder, for example, in a V-blender. The blended powder mixture is then heated to a temperature for a time sufficient to volatilize, deposit and pyrolyze at least a portion of the organo-silicate to form a silicon containing inorganic coating on the alumina powder. The temperature and atmosphere generally are the same as those previously described for thermally heat-treating the organo-silicate.

The filler powder having the coated alumina powder may be used in an organic resin, such as a thermosetting resin (e.g., for use as an encapsulant material to encapsulate a semiconductor device). The thermosetting resin may be any thermosetting resin which can be cured to form a protective layer about the semiconductor device. Among the suitable thermosetting resins are phenolic resins, alkyds, diallyl phthalate resins, polycyanate resins, epoxy resins and the like. Epoxy resins are preferred. Particular epoxy resins include those based on bisphenols, such as bisphenol A; those based on biphenyl; phenol epoxy novolac resins; cresol epoxy novolac resins; those based on trisphenol methane derivatives; those based on cyclohexane or other cyclic compounds and the like. Suitable epoxy formulations are described, for example, in U.S. Pat. No. 5,232,970, incorporated herein by reference.

Generally, when encapsulating with an epoxy resin filled with the filler powder, a curing agent is also used. Suitable curing agents include compounds having at least two primary or secondary amine groups, polycarboxylic acids and polyanhydrides, polyphenols, quanidines, biguanidines, urea-aldehyde resins, melamine-aldehyde resins, alkoxylated urea-adehyde resins, alkoxylated melamine-aldehyde resins, amides, sulfones, sulfonamides or combinations thereof.

Below are specific examples within the scope of the invention and comparative examples. The specific examples are for illustrative purposes only and in no way limit the invention described herein.

EXAMPLES

Example 1

100 Parts by weight (pbw) AlN powder having an average particle size of about 22 micrometers, available from The Dow Chemical Company, was mixed for about 2 minutes with 16.8 parts by weight of a 48 percent by weight tetraorthosilicate (TEOS) in an ethanol-water (77 percent by volume ethanol in water) solution to make an AlN-TEOS slurry. The slurry is then heated to about 150° C. until the AlN powder is dried (about 2 hours). The dried AlN coated with TEOS was then heated at 10° C./minute to 650° C. and maintained at 650° C. for 1 hour to form a first silica-coated AlN powder. The heating was conducted under a flowing 50 percent by volume air in nitrogen mixture.

The first silica-coated AlN was then mixed using the same proportions with the same TEOS-ethanol solution and dried, as described in the previous paragraph. 80 Parts by weight of this second TEOS treated AlN powder was then blended with 20 parts by weight of an alumina having an average particle size of about 1 micrometer, available from Aluminum Company of America (Alcoa), Pittsburgh, Pa., under the trade name A16 Superground. These powders were dry blended for 30 minutes in a shaker mixer (Turbula Mixer, Glen Mills, Clifton, N.J.). The blended powder was then heated to 650° C., as described above, to form the filler powder containing the coated alumina powder. By electron microscopy techniques, it was apparent that the coating only partially covered the surface of the alumina powder.

The hydrolytic stability of the AlN of the filler powder was assessed as follows. About 1 gram of the filler powder was dispersed in about 40 grams of deionized water by hand stirring for about 15 seconds. The filler powder-water dispersion was placed in a 300 mL stainless steel pressure vessel having an electric heating mantle, available from Parr Instrument Company, Moline, Ill. The filler powder-water dispersion was sealed in the pressure vessel and subsequently heated to 120° C. for 20 hours and then cooled to room temperature. The dispersion was filtered through a 0.45 micrometer filter to remove the solids. The concentration of ammonia of the clear solution was measured with an ammonia ion selective electrode as described by standard method 4500-NH$_3$ F (Section F) of *Standard Methods for the Evaluation of Water and Wastewater, Seventeenth Edition,* Washington D.C., American Public Health Association (1989). The amount of ammonia generated by the hydrolysis (i.e., so-called pressure cooker test) of the AlN of the filler powder is shown in Table 1.

The average spiral flow length of a molding composition containing about 83.5 percent by weight of the filler powder was determined by ASTM D 3123-94. The molding composition was made as follows. 450 Grams of the filler powder was mixed for about 3 minutes with 1.6 mL of gamma-glycidoxypropyltrimethoxysilane, a silane coupling agent, in a high speed mixer (Cuisinart™ food processor). The silane coupling agent was obtained from Sigma Chemical Co., St. Louis, Mo. About 419 parts by weight of this silane-treated filler powder is mixed with the following resin components:

45.13 pbw Yuka Shell RS-1407 (Tetramethyl Biphenol Epoxy)

Shell Chemical Co., Houston, Tex.

25.91 pbw HRJ 2210 Phenolic Novalac Resin

Schenectady International, Inc., Schenectady, N.Y.

5.36 pbw Quatrex 6410 Resin (Glycidyl ether of brominated Bisphenol A)

Ciba Specialty Chemicals, Los Angelos, Calif.

2.81 pbw San Apro UCAT 841 (Phenol Novolac Resin Salt)

San Apro Ltd., Kyoto, Japan.

1.90 pbw Wax OP (Ester Wax)

Hoechst Celanese Co., Somerville, N.J.

0.5 pbw Wax E (partly Saponified Wax)

Hoechst Celanese Co., Somerville, N.J.

The resin components and silane-treated filler powder were mixed for about 30 minutes using the shaker mixer. The shaken powder was melt blended in a heated roll mill at 105° C. for about 3 minutes. After the melt blend has cooled to room temperature, it was ground to less than about 18 mesh in a blender to form the filler containing molding composition.

The average spiral flow length of the molding composition was determined at 175° C., as described by ASTM D 3123-94. The results (e.g., mold release and average spiral flow length) are shown in Table 1.

The ground molding composition was pressed at 175° C. into an essentially fully dense pellet having a thickness of about 0.13 inch and diameter of about 2 inches. The thermal conductivity was determined by a laser flash technique described by W. J. Parker et al. in "Flash Method of Determining Thermal Diffusivity, Heat Capacity, and Thermal Conductivity," *Journal of Applied Physics*, Vol., 32, pp. 1679–1684 (1961). The thermal conductivity is shown in Table 1.

Example 2

30 Grams of A16 Superground Alumina were placed in a furnace in a crucible with a separate crucible containing 10 grams of TEOS. The alumina and TEOS were heated to 650° C. by the same method described in Example 1 to form the coated alumina powder. By electron microscopy techniques, it was apparent that the coating only partially covered the surface of the alumina powder.

The amount of silicon attributable to the silicon coating was determined by the difference between the amount before coating and after coating the alumina. The amount of silicon was determined by X-ray fluorescence. The amount of silicon in the coating is shown in Table 1.

Example 3

650 Parts by weight (pbw) A16 Superground Alumina powder was mixed for about 5 minutes with 109 parts by weight of a 48 percent by weight tetraorthosilicate (TEOS)in an ethanol-water (same as in Example 1) solution to make an alumina-TEOS slurry. The slurry was then heated to 150° C. until the alumina powder was dry (about 2 hours). The dried alumina coated with TEOS was then heated at 10° C./minute to 650° C. and maintained at 650° C. for 1 hour to form the coated alumina powder. The heating was conducted under a flowing 50 percent by volume air in nitrogen mixture. By electron microscopy techniques, it was apparent that the coating only partially covered the surface of the alumina powder. The amount of Si attributable to the coating was also determined and is shown in Table 1.

Example 4

About 20 parts by weight of the coated alumina of Example 3 was blended with about 80 parts by weight of a twice silica-coated AlN. The powders were blended in a shaker mixer for about 30 minutes.

The twice coated AlN was formed as follows. A first silica-coated AlN was made by the same method of Example 1. The first coated AlN was then subjected to the same process again in the absence of alumina to form the twice coated AlN.

A molding composition was formed with this blended filler powder by the same method described in Example 1. The spiral flow and thermal conductivity of the molding composition was determined by the same methods described in Example 1 and the results appear in Table 1. The hydrolytic stability of the AlN of the filler powder was also determined and appears in Table 1.

Example 5

20 Grams of A16 Superground Alumina were placed in a furnace in a crucible with a separate crucible containing 80 grams of the second TEOS-treated AlN powder of Example 1. The alumina and TEOS-treated AlN were heated to 650° C. by the same method described in Example 1 to form the coated alumina powder. By electron microscopy techniques, it was apparent that the coating only partially covered the surface of the alumina powder. The powders, after heating, were blended in the same manner described in Example 4.

Before blending, the amount of silicon attributable to the silicon coating was determined by the difference between the amount before coating and after coating the alumina. The amount of silicon was determined by X-ray fluorescence. The amount of silicon in the coating is shown in Table 1. The hydrolytic stability of the AlN of the filler powder was also determined and appears in Table 1.

Comparative Example 1

80 Parts by weight of twice treated AlN, as described by Example 4, was blended with 20 pbw of uncoated A16 Superground Alumina to form a comparable blended filler powder. The method of blending was the same as described in Example 4.

A molding composition was formed with this comparable filler powder by the same method described in Example 1. The spiral flow and thermal conductivity of the molding composition was determined by the same methods described in Example 1 and the results appear in Table 1. The hydrolytic stability of the AlN of the comparable filler powder was also determined and appears in Table 1.

TABLE 1

| Example | Hydrolytic Stability (Ammonia ppm) | Average Spiral Flow Length (in) | Release of Mold Composition During Spiral Flow/Mold Quality | Thermal Conductivity (Watts/meter-K) | Silicon Increase In Alumina After Heat Treatment (ppm) |
|---|---|---|---|---|---|
| 1 | 320 | 37 | good | 4.1 | ND |
| 2 | NA | ND | ND | ND | 2700 |
| 3 | NA | ND | ND | ND | 5000 |
| 4 | 748 | 32 | good | ND | 5000 |
| 5 | 462 | ND | ND | ND | 45 |
| Comp. 1 | 14,000 | 10 | bad | 3.7 | NA |

NA = not applicable
ND = not determined
Comp. = Comparative Example
Good = releases easily and cleanly from the mold.
Bad = mold must be pried open and composition must be chipped out of mold.

From Table 1 it is apparent that the hydrolytic stability of AlN is improved when blended with the coated alumina powder (i.e., the ammonia concentration is less than 1000 ppm, Examples 1 or 2 versus Comparative Example 1). It is also readily apparent that the filler powders containing coated alumina improves the average spiral flow length and mold release and quality compared to comparable fillers containing uncoated alumina powders (Examples 1 and 4 versus Comparative Example 1). In addition, the measured thermal conductivity of Examples 1 and 4 are greater than the thermal conductivity of Comparative Example 1. This is surprising since silica (i.e., the coating of the coated alumina in the filler powder of Examples 1 and 4) is known to have a lower thermal conductivity than alumina or AlN.

What is claimed is:

1. A filler powder comprised of an alumina powder coated with a silicon containing coating, wherein the silicon containing coating at most partially covers the surface of said coated alumina powder and the filler powder has an average spiral flow length that is 1.1 times greater than a comparable filler powder containing uncoated alumina powder as determined by ASTM D3123-94 utilizing a thermosetting epoxy resin.

2. The filler powder of claim 1 further comprising a second powder.

3. The filler powder of claim 2 wherein the coated alumina powder has an average particle of less than 2 micrometers and the second powder has an average particle size of greater than 2 micrometers.

4. The filler powder of claim 3 wherein the coated alumina powder comprises at most about 20 percent by weight of the filler powder.

5. The filler powder of claim 4 wherein the second powder is a nitride powder.

6. The filler powder of claim 5 wherein the nitride powder is aluminum nitride having a coated surface comprised of Si-Al-O-N.

7. An encapsulating material comprised of a thermosetting resin and the filler powder of claim 1.

8. A semiconductor device encapsulated by the encapsulating material of claim 7.

9. The encapsulating material of claim 7 wherein the thermosetting resin is an epoxy resin.

10. The encapsulating material of claim 9 wherein the epoxy resin is cured with a curing agent.

11. A semiconductor device encapsulated by the encapsulating material of claim 10.

12. The filler powder of claim 1 wherein the coated alumina powder has an amount of silicon in the silicon containing coating of less than about 1000 parts per million by weight of the coated alumina powder.

13. The filler powder of claim 12 wherein the amount of silicon is less than about 500 parts per million.

14. The filler powder of claim 13 wherein the amount of silicon is less than about 250 parts per million.

15. The filler powder of claim 14 wherein the amount of silicon is less than about 100 parts per million.

16. The filler powder of claim 15 wherein the amount of silicon is at least about 10 parts per million.

17. The filler powder of claim 12 wherein the amount of silicon is at least about 10 parts per million.

18. A filler powder comprised of an alumina powder coated with a silicon containing coating, wherein the silicon containing coating at most partially covers the surface of said coated alumina powder and said coating has at least about 10 parts per million to less than about 1000 parts per million of silicon by weight of the coated alumina powder.

* * * * *